(12) United States Patent
Condorelli et al.

(10) Patent No.: US 12,107,584 B2
(45) Date of Patent: Oct. 1, 2024

(54) METHOD AND SYSTEM OF CALIBRATING A CLOCK SIGNAL

(71) Applicant: STMicroelectronics S.r.l., Agrate Brianza (IT)

(72) Inventors: Riccardo Condorelli, Tremestieri Etneo / Catania (IT); Michele Alessandro Carrano, Catania (IT); Antonino Mondello, Messina (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 24 days.

(21) Appl. No.: 18/187,379

(22) Filed: Mar. 21, 2023

(65) Prior Publication Data
US 2023/0318590 A1    Oct. 5, 2023

(30) Foreign Application Priority Data
Apr. 4, 2022  (IT) .......................... 102022000006626

(51) Int. Cl.
*H03K 5/135*    (2006.01)
*H03K 5/14*     (2014.01)

(52) U.S. Cl.
CPC ............... *H03K 5/135* (2013.01); *H03K 5/14* (2013.01)

(58) Field of Classification Search
None
See application file for complete search history.

(56) References Cited

U.S. PATENT DOCUMENTS

| | | |
|---|---|---|
| 8,816,743 B1 | 8/2014 | Lu et al. |
| 2002/0196052 A1 | 12/2002 | Furuya |
| 2003/0095009 A1* | 5/2003 | Gomm .................... H03L 7/087 331/57 |
| 2013/0257497 A1 | 10/2013 | Thelen et al. |

* cited by examiner

*Primary Examiner* — Cassandra F Cox
(74) *Attorney, Agent, or Firm* — Slater Matsil, LLP

(57) ABSTRACT

In accordance with an embodiment, a method includes: producing a set of delayed replicas of a reference clock signal, wherein delayed replicas in the set of delayed replicas have respective signal edges delayed in time by a mutual time delay therebetween; producing a set of edge detecting signals comprising edge detecting signals indicative of respective distances of edges of delayed replicas in the set of delayed replicas from an edge of a clock signal having a clock period; selecting based on edge detecting signals in the set of edge detecting signals a delayed replica in the set of delayed replicas having a distance from the clock signal edge that is shorter than the distance from the clock signal edge of any other delayed replica in the set of delayed replicas.

20 Claims, 9 Drawing Sheets

METHOD AND SYSTEM OF CALIBRATING A CLOCK SIGNAL

CROSS-REFERENCE TO RELATED APPLICATIONS

This application claims the benefit of Italian Patent Application No. 10202200000662, filed on Apr. 4, 2022, which application is hereby incorporated herein by reference.

TECHNICAL FIELD

Embodiments of the present invention are directed to electronic systems in general, and more specifically to a method and a system of calibrating a clock signal.

BACKGROUND

Microcontrollers and other ICs use a variety of clocking signals to synchronize their internal operations. Depending on the application, these circuits may benefit from a procedure of calibrating clock signals to provide some specific functionalities that involve a high degree of signal precision and accuracy. For instance, in an Internet of things (IoT) context that involves a plurality of small-size and low-cost electronic devices, calibrating clock signals facilitates tracking of devices and security of communications therebetween.

As exemplified in FIG. 1, a clock signal CKo can deviate from an expected evolution over time, e.g., influenced by process, voltage and temperature (PVT) variations. A reference clock REFo may be used to calibrate the clock signal CKo to restore a high accuracy and to compensate the deviation, e.g., by counting how may periods of the reference clock REFo are included in a predefined number of cycles of the clock signal CKo. As further exemplified in FIG. 1, as the clock signal CKo and reference clock REFo are asynchronous, an extra error in clock counting is introduced during calibration, e.g., due to the initial phase error ε between clock signals CKo, REFo.

Conventional solutions to reduce the effect of the initial phase error and the synchronization error involve increasing an observation time. Such conventional solutions present various drawbacks, e.g., increased power consumption, longer calibration time, reduced continuity of service as the clock becomes available again only after the increased calibration time. Improved ways of calibrating clock signals are thus desirable.

SUMMARY

One or more embodiments facilitate providing a very accurate calibration even in the absence of an external host. In one or more embodiments, clock calibration can be performed periodically or be triggered by specific events (such as detection of a hacking attempt, for instance).

One or more embodiments may facilitate reducing costs and complexity, for instance by saving silicon area and power consumption; one or more embodiments can be interfaced with various types of buses, standard or customized; one or more embodiments may provide a way to align the clock to be calibrated with the reference clock; and one or more embodiments facilitate reducing calibration time, e.g., improving continuity of service of the calibrated clock.

BRIEF DESCRIPTION OF THE DRAWINGS

One or more embodiments will now be described, by way of non-limiting example only, with reference to the annexed Figures, wherein.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to the same embodiment. Moreover, particular conformations, structures, or characteristics may be combined in any adequate way in one or more embodiments.

The drawings are in simplified form and are not to precise scale. Throughout the figures annexed herein, like parts or elements are indicated with like references/numerals unless the context indicates otherwise, and for brevity, a corresponding description will not be repeated for each figure. The references used herein are provided merely for convenience and hence do not define the extent of protection or the scope of the embodiments. For the sake of simplicity, in the following detailed description a same reference symbol may be used to designate both a node/line in a circuit and a signal which may occur at that node or line.

Some embodiments of the present invention relate to methods of calibrating clock signals, e.g., in a system on chip (briefly, SoC). One or more embodiments may be applied to integrated circuits (ICs) and/or electronic devices in various contexts, such as microcontrollers (MCUs) employed in Internet-of-Things (IoT) applications, for instance.

Figure 1:
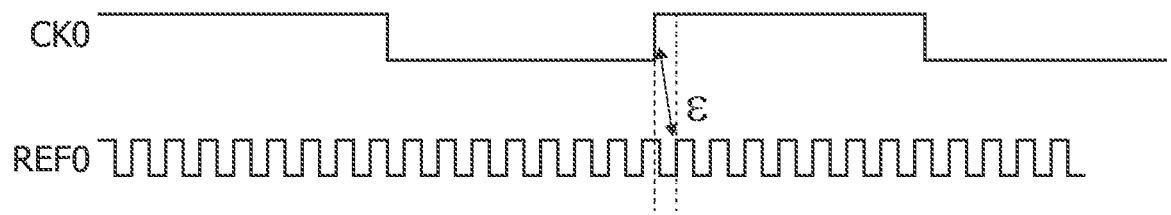
FIG. 1 has been discussed in the foregoing.
Figure 2:
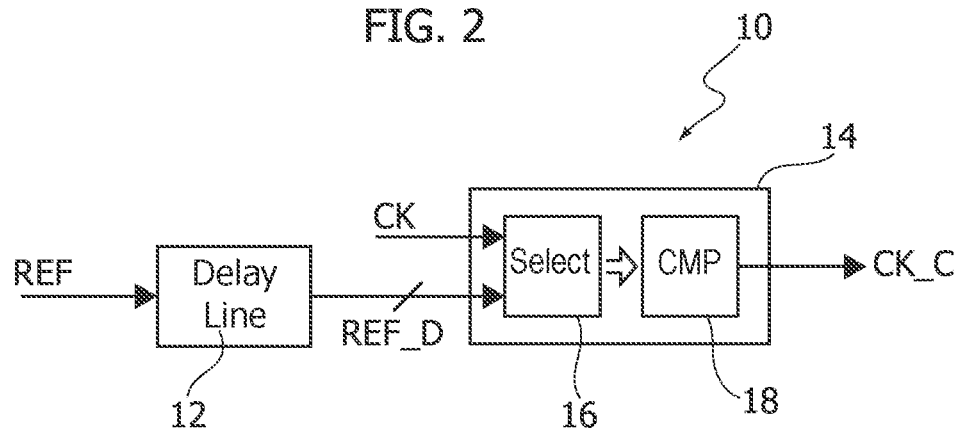
FIG. 2 is a diagram exemplary of a system as per the present disclosure.

As exemplified in FIG. 2, an improved calibration system 10 includes: an input node CK configured to receive a clock signal CK to be calibrated; a reference node REF configured to receive a reference clock signal REF; a delay line 12 coupled to the reference node REF to produce a set of delayed clock replicas REF_D comprising replicas of the reference clock signal REF (optionally, including the reference clock signal itself) delayed therebetween of a time delay Δ, as discussed in the foregoing; a calibration block 14 coupled to the delay line 12 and to the input node CK, the calibration block 14 configured to provide an error signal CK_C indicative of a distance of the frequency of the clock signal CK with respect to a selected "closest" reference clock signal in the set of reference signal delayed replicas REF_D, as discussed in the following; and user circuitry U coupled to the calibration block 14 and configured to receive the error signal CK_C.

For instance, the error signal CK_C is provided to user circuitry U (e.g., a set of various peripherals) configured to calibrate the clock signal based on the error signal CK_C using compensation techniques (such as direct or indirect frequency compensation, for instance) in a manner per se known, so that a corresponding description will not be repeated for the sake of brevity.

For the sake of simplicity, one or more embodiments are discussed in the following mainly with respect to a reference clock signal having a reference period (that is the inverse of the frequency) shorter than the half-period of the clock signal to be calibrated, facilitating a quicker calibrating procedure. Such an example of reference period is purely exemplary and in no way limiting as in one or more embodiments, the reference period may also be equal or longer than the half-period of the clock signal to be calibrated.

As exemplified in FIG. 2, the calibration block 14 includes: a selecting block 16 configured to select a reference signal replica in the set of delayed reference signal delayed replicas REF_D, wherein the selected reference signal replica presents a reduced (ideally, minimum) phase error with the clock signal CK, so that it is the replica among replicas in the set of delayed reference signal delayed replicas REF_D that is most aligned to the clock signal CK, as discussed in the foregoing; and a comparator circuit block 18 (e.g., a frequency counter, per se known) configured to receive the selected reference signal replica and the clock signal CK, the comparator circuit block 18 configured to perform a comparison between periods of the clock signal and of the selected reference signal replica, obtaining as a result of the comparison an (e.g., differential) error signal CK_C indicative of a difference therebetween.

As exemplified in FIG. 2, before starting the calibration process 14 the reference clock REF is delayed 12 so as to produce and select a reference clock that has a first (e.g., rising) edge aligned as much as possible to the corresponding first (e.g., rising) clock signal CK to be calibrated.

A method as exemplified in FIGS. 2 to 12, includes: producing (for instance, 12) a set of delayed replicas (for instance, REF_D) of a reference clock signal (for instance, REF), wherein delayed replicas (for instance, REF_D1, REF_Dj, REF_DN) in the set of delayed replicas have respective signal edges delayed in time (for instance, 121, 12j, 12N) by a mutual time delay therebetween; producing (for instance, 401, 40j, 40N; 701, 70j, 70N; 901, 90j, 90N; 1101, 110j, 110N) a set of edge detecting signals (for instance, ED1, EDj, EDN) comprising edge detecting signals indicative of respective distances of edges of delayed replicas in the set of delayed replicas from an edge of a clock signal having a clock period; selecting (for instance, 16; 160, 162) based on edge detecting signals in the set of edge detecting signals a delayed replica in the set of delayed replicas having a distance from the clock signal edge that is shorter than the distance from the clock signal edge of any other delayed replica in the set of delayed replicas; performing a comparison (for instance, 18) of the clock period of the clock signal and of the selected delayed replica, obtaining as a result of the comparison, an error signal (for instance, CK_C) indicative of a difference therebetween; and providing the error signal to user circuitry (for instance, U) to calibrate the clock signal based on the error signal.

As exemplified herein, the method comprises producing (for instance, 400) a delayed clock signal (for instance, CK_D) having edges delayed by a time delay (for instance, δ) from respective edges of the clock signal. Edge detecting signals in the set of edge detecting signals are produced having a first logic value in response to delayed replicas in the set of delayed replicas having edges falling inside a time interval between edges of the clock signal and edges of the delayed clock signal, and having a second logic value in response to delayed replicas in the set of delayed replicas having edges falling outside the time interval between edges of the clock signal and edges of the delayed clock signal.

As exemplified in FIGS. 2 to 12, a system includes: in input node (e.g., CK) configured to receive a clock signal CK having a clock period; a reference node (e.g., REF) configured to receive a reference clock signal REF; a delay line (e.g., 12) coupled to the reference node to receive the reference clock signal, the delay line configured to produce a set of delayed replicas (e.g., REF_D) of the reference clock signal, wherein delayed replicas (e.g., REF_D1, REF_Dj, REF_DN) in the set of delayed replicas have respective signal edges delayed in time (e.g., 121, 12j, 12N) by a mutual time delay therebetween; a set of edge detecting stages (e.g., 401, 40j, 40N; 701, 70j, 70N; 901, 90j, 90N; 1101, 110j, 110N) coupled to the input node and to the delay line, the set of detecting stages configured to produce a set of edge detecting signals (e.g., ED1, EDj, EDN) comprising edge detecting signals indicative of respective distances of edges of delayed replicas in the set of delayed replicas from an edge of the clock signal; selecting circuitry (e.g., 160, 162) coupled to set of edge detecting stages and configured to select, based on edge detecting signals in the set of edge detecting signals, a delayed replica (e.g., REF_Dj) in the set of delayed replicas, wherein the selected delayed replica has a distance from the clock signal edge that is shorter than the distance from the clock signal edge of any other delayed replica (e.g., REF_D1, REF_DN) in the set of delayed replicas; and comparator circuitry (e.g., 18) configured to perform a comparison of the clock period of the clock signal and of the selected delayed replica, obtaining as a result of the comparison, an error signal (e.g., CK_C) indicative of a difference therebetween, wherein the comparator circuitry is configured to provide the error signal to user circuitry (e.g., U), wherein the user circuitry is configured to calibrate the clock signal based on the error signal.

Figure 3:
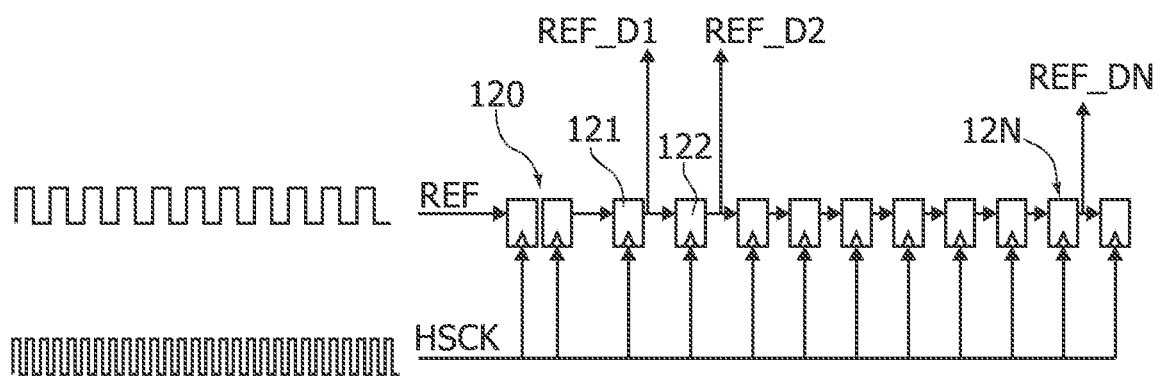
FIG. 3 is a diagram exemplary of a portion of FIG. 2.

As exemplified in FIG. 3, the delay line 12 may include a set of (e.g., flip flop) stages 120, 121, 122, 123, 12N each configured to receive a temporization signal HSCK that has its temporization frequency higher than the reference frequency of the reference signal REF (corresponding to the temporization period being lower than the reference period). For instance, the frequency of the sampling signal HSCK is a multiple (e.g., at least twice, preferably at least ten-fold to reduce errors) of the frequency of the reference signal REF.

As exemplified in FIG. 3, flip flop stages in the set of flip flop stages 120, 121, 122, 123, 12N delay the reference signal REF by a time delay, e.g., proportional to the clock period of the temporization signal HSCK, providing the set of delayed replicas REF_D comprising an integer number N of delayed replicas REF_D1, ..., REF_Dj, ..., REF_DN, for instance having a mutual delay therebetween that is an integer multiple of the clock period of the temporization signal HSCK. For instance, a j-th reference signal delayed replica REF_Dj may be expressed as REF_Dj(t)=REF(t−j*ΔT) where ΔT may be equal to the clock period of the temporization signal HSCK and j is an integer proportionality factor.

As exemplified in FIG. 3, the minimum time delay ΔT introduced between two time-consecutive delayed replicas, e.g., REF_D1 and REF_D2, in the set of reference signal delayed replicas REF_D is equal to the setup time of flip-flops, e.g., 121, 122, in the set of flip flop stages 120, 121, 122, 123, 12N.

Figure 4:
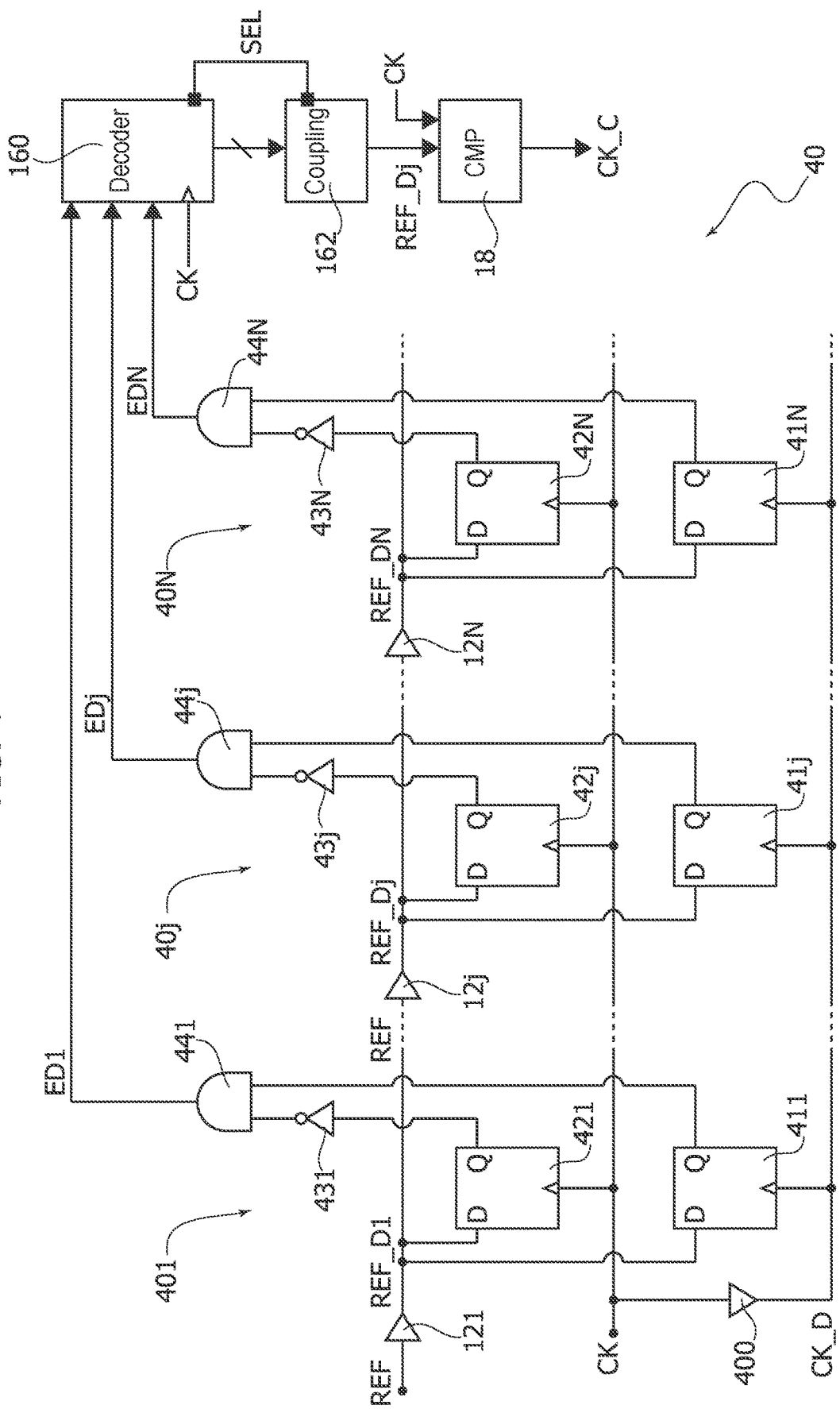
FIG. 4 is a diagram exemplary of a system as per the present disclosure.

In an alternative scenario as exemplified in FIG. 4, the delay line 12 comprises a plurality of delay stages 121, 122, 12N, e.g., buffer stages, each configured to delay the reference clock REF of about a time delay δ, e.g., a fraction of the period of the reference clock REF.

For the sake of simplicity, in the foregoing the reference clock REF is considered included in the set of delayed reference clock replicas REF_D1, REF_Dj, REF_DN as a replica of the clock delayed by a zero time-delay.

As exemplified in FIG. 4, a calibration system 40 includes: a clock delay element 400, e.g., a buffer, coupled to the clock node CK and configured to produce a delayed version CK_D of the input clock signal CK; a set of edge detecting stages 401, ..., 40j, ..., 40N coupled to the input node CK, the clock delay element 400 and to the plurality of delay stages 121, 122, 12N of the delay line 12, the set of edge detecting stages 401, ..., 40j, ..., 40N configured to receive the clock signal CK, the delayed clock signal CK_D and the set of reference signal delayed replicas REF_D1, ..., REF_Dj, ..., REF_DN and to produce a set of edge detection signals ED1, ..., EDj, ..., EDN indicative of a time (or phase) relation between the set of replicas REF_D1, ..., REF_Dj, ..., REF_DN and a first (e.g., rising) edge of the clock signal CK; a decoder block 160 coupled to the set of edge detecting stages 401, ..., 40j, ..., 40N and (optionally) to the input node CK, the decoder block 160 configured to produce a selection indicator SEL indicative of the index (e.g., j) of the delayed replica (e.g., REF_Dj) in the set of reference signal delayed replicas is to be provided to the comparator circuit block 18, as discussed in the foregoing; a coupling block 162 coupled to the decoder block 160 to receive therefrom the selection indicator SEL and the set of reference signal delayed replicas REF_D, the coupling block 162 configured to select from the set of delayed replicas a delayed replica "closest" to the clock signal edge based on the selection indicator SEL (e.g., selecting the j-th reference signal replica REF_Dj based on the index j stored in the selection signal SEL), providing the selected delayed replica (e.g., REF_Dj) to the comparator circuit block 18 as a result; and the comparator circuit block 18 coupled to the coupling block 162 to receive the selected delayed replica therefrom, the comparator circuit block 18 configured to produce the error signal CK_C based on a difference between the selected reference signal replica (e.g., REF_Dj) and the clock signal CK.

For the sake of simplicity, principles underlying embodiments are discussed in the following mainly with reference to embodiments where the calibration system comprises a set of three edge detecting stages 401, ..., 40j, ..., 40N, being otherwise understood that such an amount is purely exemplary and in no way limiting, as notionally any integer number N of stages may be used.

Figure 5:
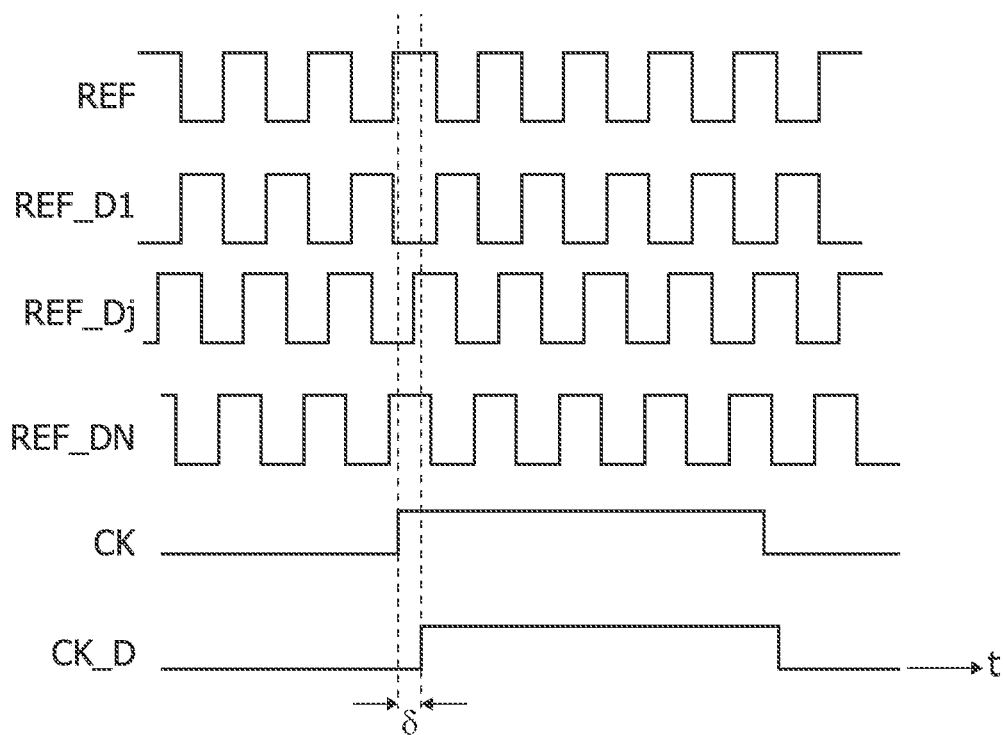
FIG. 5 is a time diagram exemplary of signals in an embodiment as exemplified in FIG. 4.

As exemplified in FIG. 5, the delayed clock signal CK_D has the (e.g., rising) edge that is delayed by a time delay δ with respect to the same (e.g., rising) edge of the clock signal CK.

As exemplified in FIGS. 4 and 5, edge detecting stages in the set of edge detecting stages 401, ..., 40j, ..., 40N includes: first sampling stages (e.g., flip-flops) 411, 41j, 41N having an input node D coupled to the delay line 12 to receive a delayed replica (e.g., REF_Dj for the j-th first flip-flop 41j) of the reference signal REF and a temporization node coupled to the delay element 400 to receive the delayed clock signal CKD, the first sampling stages 411, 41j, 41N further having an output node Q configured to provide a respective value of the respective delayed replica (e.g., REF_Dj) at the time instant of the first (e.g., rising) edge of the delayed clock signal CK_D; second sampling stages (e.g., flip-flops) 421, 42j, 42N having an input node D coupled to the delay line 12 to receive a delayed replica (e.g., REF_Dj for the j-th second flip-flop 42j) of the reference signal REF and a temporization node coupled to the input clock node CK to receive the clock signal CK, the second sampling stages 411, 41j, 41N further having an output node Q configured to provide a respective value of the respective delayed replica (e.g., REF_Dj) at the time instant of the first (e.g., rising) edge of the clock signal CK; first logic (e.g., NOT) gates 431, 43j, 43N coupled to the output node of respective second sampling stages 421, 42j, 42N; and second logic (e.g., AND) gates 441, 44j, 44N comprising first input nodes coupled to respective output nodes of first logic gates 431, 43j, 43N and second input nodes coupled to respective output nodes Q of the second sampling stages (e.g., flip-flops) 421, 42j, 42N, the second logic gates 441, 44j, 44N being configured to provide edge detecting signals ED1, EDj, EDN having a value equal to the logical AND combination of sampled values of the respective reference signal delayed replica (e.g., REF_Dj).

As exemplified in FIG. 5, the clock signal CK and the delayed signal CK_D are used to sample (e.g., via j-th flip-flops 41j, 42j) each j-th delayed replica (e.g., REF_Dj) in the set of reference signal delayed replicas REF_D1, ..., REF_Dj, ..., REF_DN.

As exemplified in FIGS. 4 and 5, the sampled signals are then provided to the j-th logic circuitry (e.g., j-th inverter 43j and j-th AND gate 44j) of each j-th edge detecting stage (e.g., 40j). For instance, each j-th logic circuitry (e.g., 43j, 44j) in each j-th stage (e.g., 40j) is configured to provide the respective j-th detection signal (e.g., EDj) having a first value when the clock signal CK samples the j-th delayed replica (e.g., REF_Dj) with a first logic value (e.g., "0") while the delayed clock signal CK_D samples the same j-th delayed replica (e.g., REF_Dj) with the opposite logic value (e.g., "1"). In other words, j-th logic circuitry (e.g., 43j, 44j) in each j-th stage (e.g., 40j) is configured to detect which delayed replica (e.g., REF_Dj) in the set of delayed replicas has a (e.g., rising edge) at a time instance in the intercourse of a (e.g., rising) edge of the clock signal and a same edge of the delayed clock signal CK_D.

As exemplified in FIGS. 4 and 5, the edge detection stages 401, 40j, 40N assert the edge detecting signals ED1, EDj, EDN: with a first (e.g., "0") logic value in case the (e.g., rising) edge of the respective delayed replica (e.g., REF_Dj) falls within the time interval between (e.g., rising) edges of the clock signal CK and the delayed clock signal CK_D; and with a second (e.g., "1") logic value in case the (e.g., rising) edge of the respective delayed replica (e.g., REF_Dj) falls outside the time interval between (e.g., rising) edges of the clock signal CK and the delayed clock signal CK_D.

Ideally, the edge detecting stage produces only one edge detecting signal with the first value corresponding to the reference signal delay replica (e.g., REF_Dj) that has a minimum delay with respect to the clock CK, that is the replica that has its (e.g., rising) edge nearest to the same edge of the clock signal CK is the ones that is sampled as zero by CK and as one by CKdel.

Due to non-linearities and meta-stability, more than one candidate for "closest" signal to the clock signal CK may be detected by the edge detecting stages 401, 40j, 40N. In order to counter such undesired effects, a decoder circuit block as exemplified in FIGS. 4 and 6 takes the edge detecting signals ED1, EDj, EDN and selects one among them, as exemplified in FIG. 6. For instance, the decoder block 160 may be configured according to a priority encoder logic, in a manner per se known.

Figure 6:
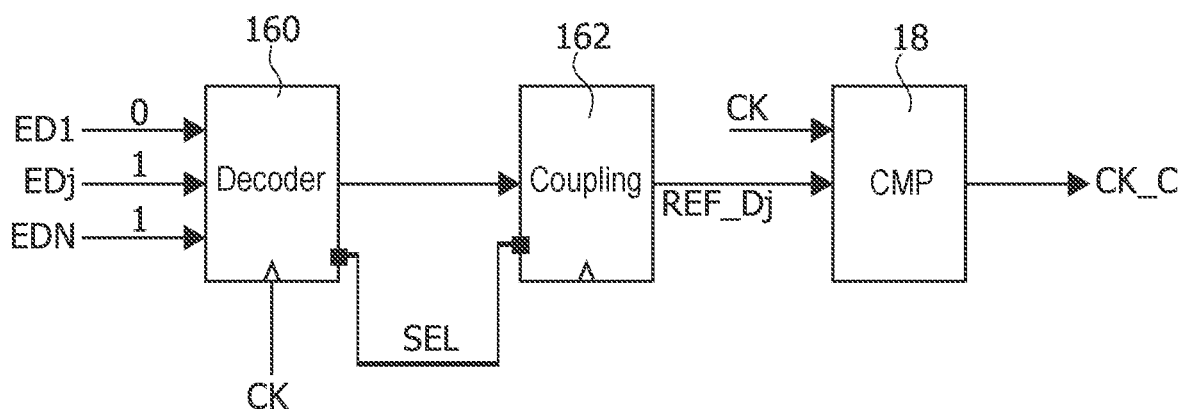
FIG. 6 is a diagram exemplary of a portion of FIG. 4.

As exemplified in FIG. 6, the decoder block 160 (e.g., optionally timed via the clock signal CK) may be configured to produce a selection signal SEL that provides an indication (e.g., the index value) of which one of the edge detecting signals ED1, EDj, EDN that has a first (e.g., "1") logic value has to be selected. For instance, in the exemplary scenario exemplified in FIGS. 5 and 6, both the j-th edge detecting signal EDj and the N-th edge detecting signal EDN have the first logic value.

As exemplified in FIG. 6, the decoder 160 is configured to select either one the j-th reference signal replica first REF_Dj or the N-th reference signal replica REF_DN as the "closest" reference signal by, e.g.: using a "first-come first-served" logic, providing the delayed replica that has a lower index among the two, e.g., REF_Dj; or using an "average" logic, the decoder selects the signal that is intermediate adjacent edge detecting signal with the first logic value, e.g., REF_Dj.

As exemplified in FIG. 4, the method includes: storing (for instance, 421, 42j, 42N) first logic values of delayed replicas in the set of delayed replicas at time instants of edges of the clock signal; storing (for instance, 411, 41j, 41N) second logic values of delayed replicas in the set of delayed replicas at time instants of edges of the delayed clock signal; logically inverting (for instance, 431, 43j, 43N) the memorized first logic values of delayed replicas in the set of delayed replicas, providing inverted first logic values as a result; and producing the set of edge detecting signals as a result of applying a logical AND operation (for instance, 441, 44j, 44N) to the inverted first logic values of the delayed replicas in and to the memorized second logic values of delayed replicas of the set of delayed replicas.

As exemplified in FIG. 4, the system comprises a clock delay element (e.g., 400) coupled to the input node to receive the clock signal (e.g., CK) and to the set of edge detecting stages (e.g., 401, 40j, 40N; 901, 90j, 90N), the clock delay element configured to produce a delayed clock signal (e.g., CK_D) having edges delayed by a time delay (e.g., δ) from respective edges of the clock signal. Edge detecting stages in the set of edge detecting stages are configured to produce edge detecting signals in the set of edge detecting signals: having a first logic value in response to delayed replicas in the set of delayed replicas having edges falling inside a time interval (e.g., δ) between edges of the clock signal and edges of the delayed clock signal; and having a second logic value in response to delayed replicas in the set of delayed replicas having edges falling outside the time interval between edges of the clock signal and edges of the delayed clock signal.

As exemplified in FIG. 4, the set of edge detecting stages (e.g., 401, 40j, 40N) includes: a first set of flip-flop devices (e.g., 421, 42j, 42N) configured to memorize first logic values of delayed replicas in the set of delayed replicas at time instants of edges of the clock signal; a second set of flip-flop devices (e.g., 411, 41j, 41N) configured to memorize second logic values of delayed replicas in the set of delayed replicas at time instants of edges of the delayed clock signal; a set of logical inversion gates (e.g., 431, 43j, 43N) coupled to the first set of flip-flop devices and configured to logically invert the memorized first logic values of delayed replicas in the set of delayed replicas, providing inverted first logic values as a result; and a set of logical AND gates (e.g., 441, 44j, 44N) coupled to the set of logical inversion gates and to the second set of flip-flop devices, the set of logical AND gates configured to produce the set of edge detecting signals as a result of applying a logical AND operation to the inverted first logic values of delayed replicas and to the memorized second logic values of delayed replicas in the set of delayed replicas.

Figure 7:
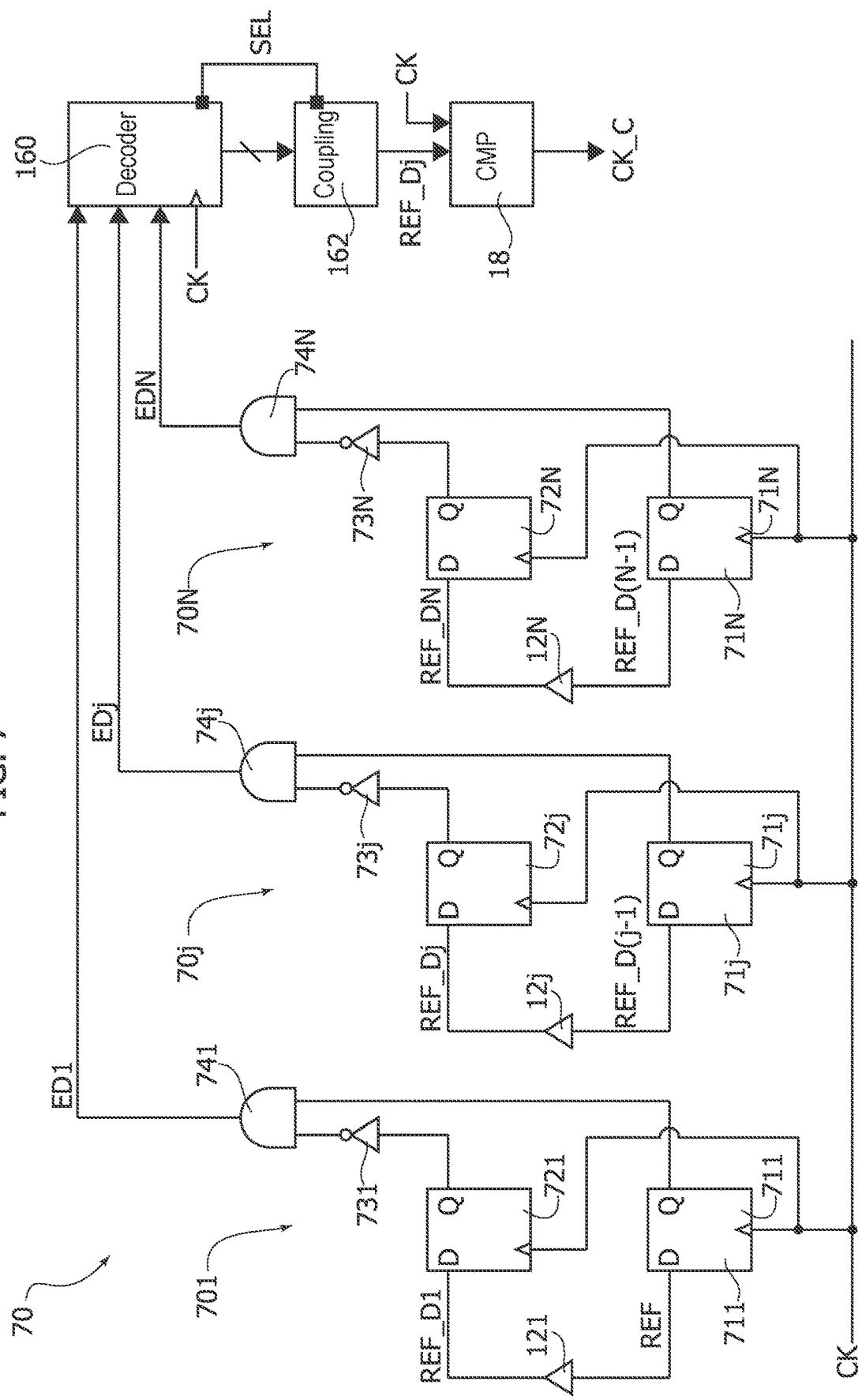
FIG. 7 is a diagram exemplary of an alternative system as per the present disclosure.
Figure 8:
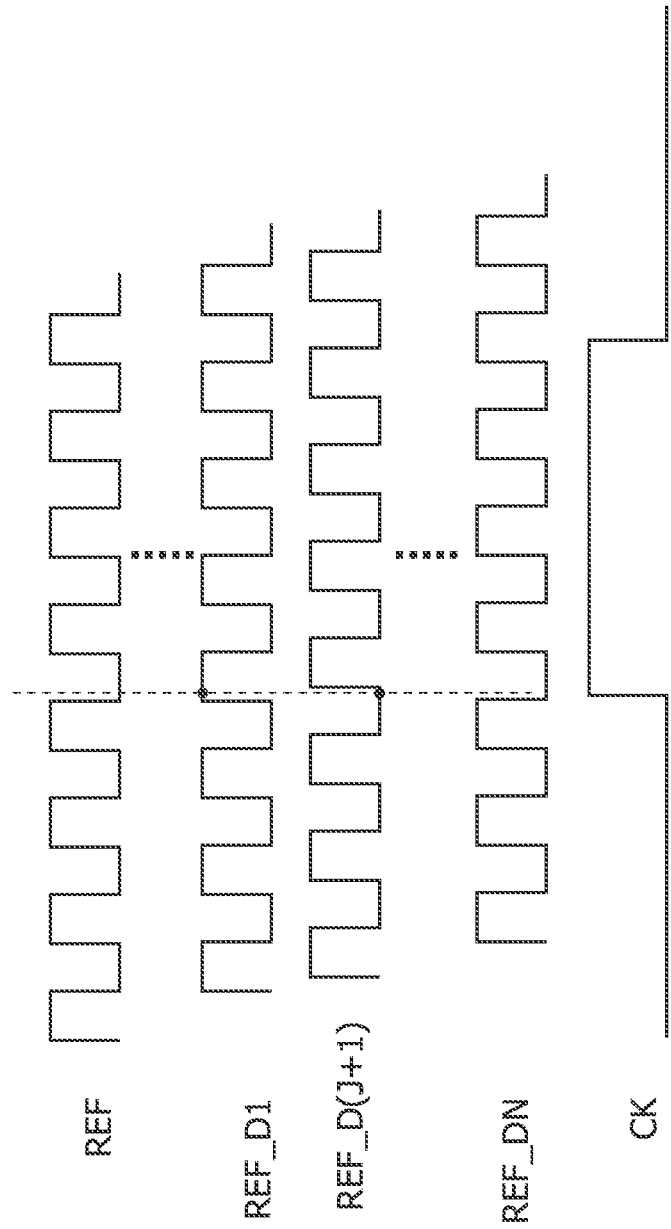
FIG. 8 is a time diagram exemplary of signals in an embodiment as exemplified in FIG. 71

As exemplified in FIGS. 7 and 8, in a scenario alternative to that of FIGS. 4 and 5, an alternative system 70 uses a single clock signal CK to sample the delayed replicas REF_D1, . . . , REF_Dj, . . . , REF_DN of the reference signal REF. For instance, as exemplified in FIG. 7 the system 70 comprises a set of edge detecting stages 701, . . . , 70j, . . . , 70N coupled to the input node CK and coupled to the delay line 12, the set of edge detecting stages j701, . . . , 70j, . . . , 70N configured to receive the clock signal CK and the set of delayed replicas REF_D1, . . . , REF_Dj, . . . , REF_DN and to produce a set of edge detection signals ED1, . . . , EDj, . . . , EDN indicative of a time (or phase) relation between the set of replicas REF_D1, . . . , REF_Dj, . . . , REF_DN and a first (e.g., rising) edge of the clock signal CK.

As exemplified in FIGS. 7 and 8, edge detecting stages in the set of edge detecting stages 701, . . . , 70j, . . . , 70N include: first sampling stages (e.g., flip-flops) 711, 71j, 71N having an input node D coupled to the delay line 12 to receive a (j−1)-th delayed replica (e.g., REF_D1 for the j-th first flip-flop 71j in the considered example in which j=2 and N=3) of the reference signal REF and a temporization node coupled to the input clock CK, the first sampling stages 711, 71j, 71N further having an output node Q configured to provide a respective value of the respective delayed replica (e.g., REF_D1) at the time instant of the first (e.g., rising) edge of the clock signal CK; second sampling stages (e.g., flip-flops) 721, 72j, 72N having an input node D coupled to the delay line 12 to receive a j-th delayed replica (e.g., REF_Dj for the j-th second flip-flop 72j) of the reference signal REF and a temporization node coupled to the input clock node CK to receive the clock signal CK, the second sampling stages 411, 41j, 41N further having an output node Q configured to provide a respective value of the respective delayed replica (e.g., REF_Dj) at the time instant of the first (e.g., rising) edge of the clock signal CK; first logic (e.g., NOT) gates 731, 73j, 73N coupled to the output node of respective second sampling stages 421, 42j, 42N; and second logic (e.g., AND) gates 741, 74j, 74N comprising first input nodes coupled to respective output nodes of first logic gates 731, 73j, 73N and second input nodes coupled to respective output nodes Q of the first sampling stages (e.g., flip-flops) 711, 71j, 71N, the second logic gates 741, 74j, 74N being configured to provide edge detecting signals ED1, EDj, EDN having a value equal to the logical AND combination of sampled values of the respective reference signal delayed replica (e.g., REF_Dj).

As exemplified in FIG. 8, the clock signal CK is used to sample (e.g., via N-th flip-flops 71N, 72N) adjacent replicas (e.g., j-th replica REF_Dj and N-th replica REF_DN) in the set of reference signal delayed replicas REF, REF_D1, ..., REF_Dj, ..., REF_DN.

As exemplified in FIGS. 7 and 8, the sampled signals are then provided to the j-th logic circuitry (e.g., N-th inverter 73N and N-th AND gate 74N) of each j-th edge detecting stage (e.g., 70N).

For instance, each j-th logic circuitry (e.g., 73N, 74N) of each j-th stage (e.g., 70N) is configured to: assert the respective j-th detection signal (e.g., EDN) with a first value (e.g., "0") when the clock signal CK samples both adjacent delayed replicas (e.g., REF_D(j+1), REF_DN) with a same logic value (e.g., "1"); and assert the respective j-th detection signal (e.g., EDN) with a second value (e.g., "1") when the clock signal CK samples delayed replicas (e.g., REF_Dj, REF_D(j+1)) with logic values different therebetween (e.g., REF_Dj with the first value "1" and REF_D(j+1) with the second value "0", as shown in FIG. 8).

In other words, each j-th logic circuitry (e.g., 73N, 74N) of each j-th stage (e.g., 70N) is configured to detect which adjacent delayed replicas (e.g., REF_Dj, REF_D(j+1)) are timed so that a rising edge of the clock signal CK falls in an interval between rising edges of the adjacent delayed replicas.

In this way, for instance, the j-th reference signal delayed REF_Dj replica that is sampled by the clock signal CK at the first value (e.g., "0") while the adjacent or consecutive reference signal delayed replica REF_D(j+1) at the second value (e.g., "1") will be the selected (e.g., via the decoder 160, as discussed in the foregoing) as the nearest clock, that is the signal with less phase delay, with respect to the edge of the clock signal CK.

As exemplified in FIGS. 7 to 12, edge detecting signals in the set of edge detecting signals are produced (for instance, 701, 70j, 70N; 1101, 110j, 110N): having a first logic value in response to a pair of time-consecutive delayed replicas in the set of delayed replicas having edges that sample the clock signal as having a same logic value; and having a second logic value in response to the pair of time-consecutive delayed replicas in the set of delayed replicas having edges that sample the clock signal as having different logic values therebetween.

As exemplified in FIG. 7, the method includes: storing (for instance, 711, 71j, 71N) first logic values of a first subset of delayed replicas (for instance, REF, REF_D1, REF_Dj) in the set of delayed replicas at time instants of edges of the clock signal; and storing (for instance, 721, 72j, 72N) second logic values of a second subset of delayed replicas (for instance, REF_D1, REF_Dj, REF_D(j+1), REF_D(N-1), REF_DN) in the set of delayed replicas at time instants of edges of the clock signal. The set of delayed replicas includes the reference signal, and the first subset of delayed replicas and the second subset of delayed replicas comprise delayed replicas of the reference clock signal that are pairwise time-consecutive.

Still in the considered example of FIG. 7, the method includes: logically inverting (for instance, 731, 73j, 73N) the memorized second logic values of the second subset of delayed replicas in the set of delayed replicas, providing inverted second logic values as a result; and producing the set of edge detecting signals as a result of applying a logical AND operation (for instance, 741, 74j, 74N) to the memorized first logic values of the first subset of delayed replicas and to the inverted second logic values of the second subset of delayed replicas in the set of delayed replicas.

As exemplified in FIGS. 7 to 12, the set of edge detecting stages (e.g., 70j, 70N; 1101, 110j, 110N) are configured to produce the set of edge detecting signals: having a first logic value in response to a pair of time-consecutive delayed replicas in the set of delayed replicas having edges that sample the clock signal as having a same logic value and having a second logic value in response to the pair of time-consecutive delayed replicas in the set of delayed replicas having edges that sample the clock signal as having different logic values therebetween.

As exemplified in FIG. 7, the system includes: a first set of flip-flop devices (for instance, 711, 71j, 71N) configured to memorize first logic values of a first subset of delayed replicas in the set of delayed replicas (for instance, REF_D1, REF_Dj, REF_D(j+1), REF_D(N-1), REF_DN) at time instants of edges of the clock signal; and a second set of flip-flop devices (for instance, 721, 72j, 72N) configured to memorize second logic values of a second subset of delayed replicas in the set of delayed replicas at time instants of edges of the clock signal. The set of delayed replicas includes the reference signal, and the first subset of delayed replicas and the second subset of delayed replicas comprise delayed replicas that are pairwise time-consecutive.

For instance, still in the considered example, the system includes: a set of logical inversion gates (for instance, 731, 73j, 73N) configured to logically invert the memorized second logic values of the second subset of delayed replicas in the set of delayed replicas, providing inverted second logic values as a result; and a set of logical AND gates (for instance, 741, 74j, 74N) configured to produce the set of edge detecting signals as a result of applying a logical AND operation to the memorized first logic values of the first subset of delayed replicas and to the inverted second logic values of the second subset of delayed replicas in the set of delayed replicas.

Figure 9:
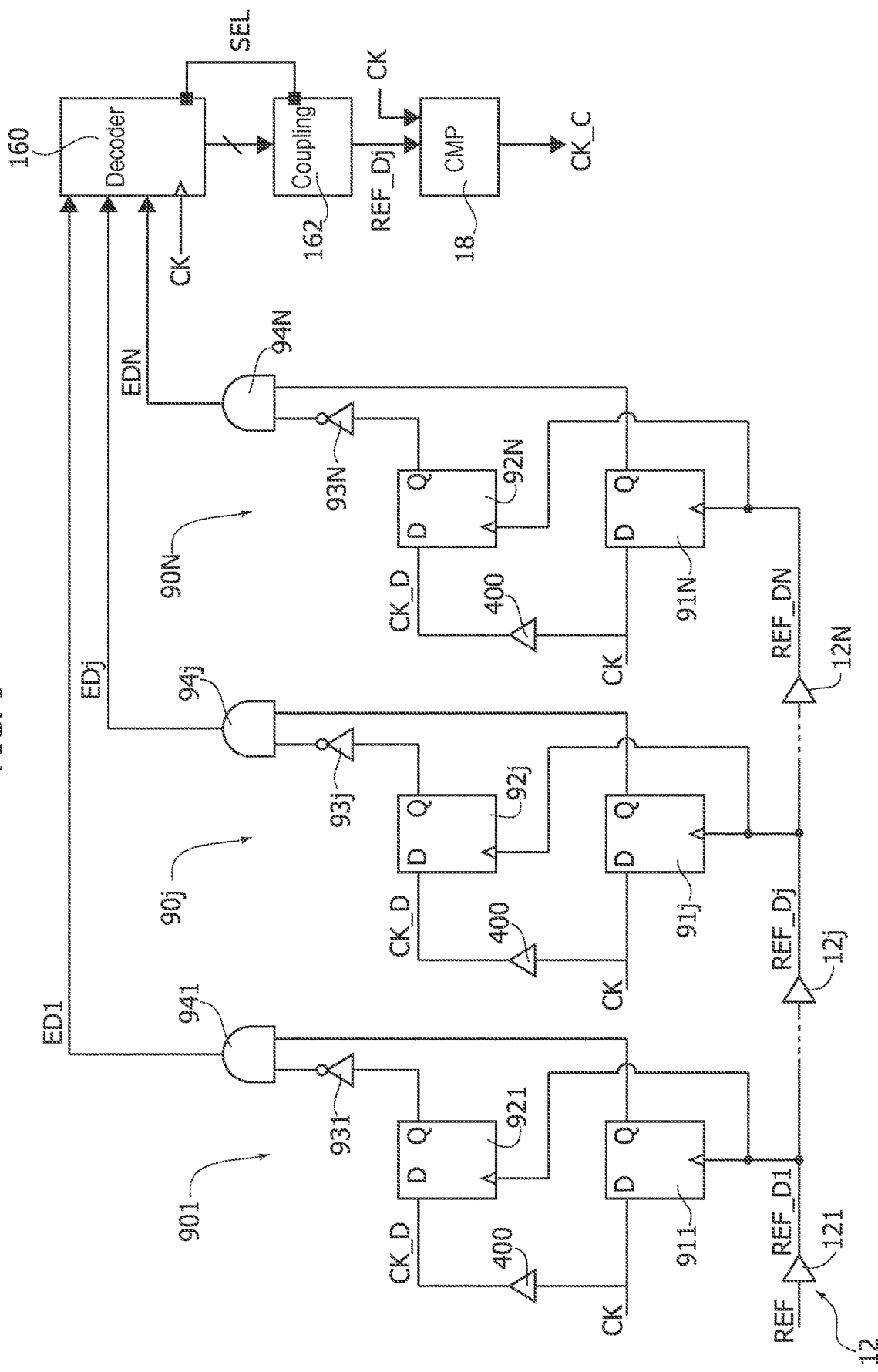
FIG. 9 is a diagram exemplary of an alternative system as per the present disclosure.
Figure 10:
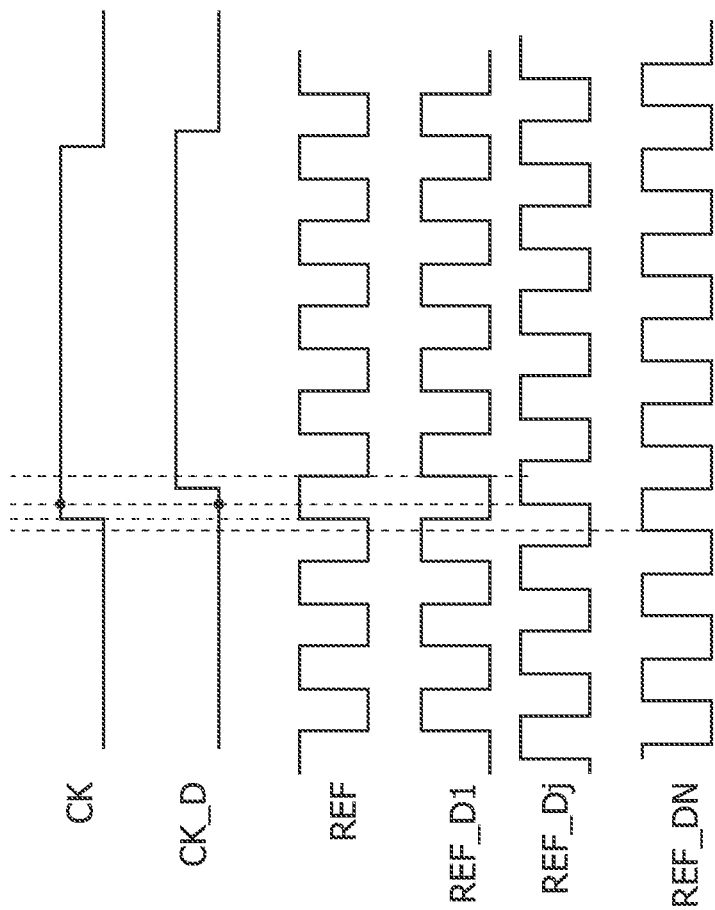
FIG. 10 is a time diagram exemplary of signals in an embodiment as exemplified in FIG. 9.

As exemplified in FIGS. 9 and 10, in another scenario alternative to that of FIGS. 4 and 5, an alternative system 90 uses a delay replica in the delayed replicas REF_D1, ..., REF_Dj, ..., REF_DN to sample the clock signal CK and the delayed version CK_D thereof. For instance, as exemplified in FIG. 9 the system 90 comprises a set of edge detecting stages 901, ..., 90j, ..., 90N coupled to the input node CK, to the clock delay element 400 and to the delay line 12, the set of edge detecting stages 901, ..., 90j, ..., 90N configured to receive the clock signal CK and the set of delayed replicas REF_D1, ..., REF_Dj, ..., REF_DN and to produce a set of edge detection signals ED1, ..., EDj, ..., EDN indicative of a time (or phase) relation between the set of replicas REF_D1, ..., REF_Dj, ..., REF_DN and a first (e.g., rising) edge of the clock signal CK.

As exemplified in FIGS. 9 and 10, edge detecting stages in the set of edge detecting stages 901, ..., 90j, ..., 90N of the system 90 includes: first sampling stages (e.g., flip-flops) 911, 91j, 91N having an input node D coupled to the input clock CK and a temporization node coupled to the delay line 12 receive a j-th delayed replica (e.g., REF_Dj for the j-th first flip-flop 91j) of the reference signal REF, the first sampling stages 911, 91j, 91N further having an output node Q configured to provide a respective value of the clock signal CK at the time instant of the first (e.g., rising) edge of the respective delayed replica (e.g., REF_Dj); second sampling stages (e.g., flip-flops) 921, 92j, 92N having an input node D coupled to the clock delay element 400 to receive the delayed clock signal CK_D therefrom and a temporization node coupled to the delay line 12 to receive a j-th delayed replica (e.g., REF_Dj for the j-th second flip-flop 92*j*) of the reference signal REF, the second sampling stages 911, 91*j*, 91N further having an output node Q configured to provide a respective value of the delayed clock signal CK_D at the time instant of the first (e.g., rising) edge of the respective delayed replica (e.g., REF_Dj); first logic (e.g., NOT) gates 931, 93*j*, 93N coupled to the output nodes Q of respective second sampling stages 921, 92*j*, 92N; and second logic (e.g., AND) gates 941, 94*j*, 94N comprising first input nodes coupled to respective output nodes Q of first logic gates 931, 93*j*, 93N and second input nodes coupled to respective output nodes of the first sampling stages (e.g., flip-flops) 911, 91*j*, 91N, the second logic gates 941, 94*j*, 94N being configured to provide edge detecting signals ED1, EDj, EDN having a value equal to the logical AND combination of sampled values of the clock signal CK and the delayed version CK_D thereof.

As exemplified in FIG. 10, the set of reference signal delayed replicas REF, REF_D1, ..., REF_Dj, ..., REF_DN is used to sample (e.g., via j-th flip-flop 91*j*, 92*j*) the clock signal CK and the delayed version CK_D thereof.

As exemplified in FIGS. 9 and 10, the sampled signals are then provided to the j-th logic circuitry (e.g., j-th inverter 93*j* and j-th AND gate 94*j*) of each j-th edge detecting stage (e.g., 90*j*).

For instance, each j-th logic circuitry (e.g., 93*j*, 94*j*) in each j-th stage (e.g., 90*j*) is configured to: provide the respective j-th detection signal (e.g., EDj) having a first value (e.g., "0") when the clock signal CK and the delayed version thereof CK_D are sampled by the respective delayed replica (e.g., REF_j) of the reference signal REF with a same logic value (e.g., "1"); and provide the respective j-th detection signal (e.g., EDj) having a second value (e.g., "1") when the clock signal CK and the delayed version are sampled by the respective delayed replica (e.g., REF_j) of the reference signal REF with different logic values (e.g., CK sampled by REF_Dj with the first value "0" and CK_D sampled by REF_Dj with the second value "1", as shown in FIG. 10).

In this way, for instance, the j-th reference signal delayed REF_Dj replica that samples the clock signal CK at the first value (e.g., "0") while sampling the delayed clock signal CK_D at the second value (e.g., "1") will be the selected (e.g., via the decoder 160, as discussed in the foregoing) as the nearest reference clock, that is the reference clock signal with minimum phase delay with respect to the edge of the clock signal CK.

As exemplified in FIG. 9, the method includes: storing (for instance, 911, 91*j*, 91N) first logic values of the clock signal at time instants of edges of delayed replicas in the set of delayed replicas; storing (for instance, 921, 92*j*, 92N) second logic values of the delayed clock signal at time instants of edges of delayed replicas in the set of delayed replicas; logically inverting (for instance, 931, 93*j*, 93N) the memorized second logic values of the delayed clock signal (CK_D), providing inverted second logic values as a result; and producing the set of edge detecting signals as a result of applying a logical AND operation (for instance, 941, 94*j*, 94N) to the memorized first logic values of the clock signal and to the inverted second logic values of the delayed clock signal.

As exemplified in FIG. 9, the system includes: a first set of flip-flop devices (e.g., 911, 91*j*, 91N) configured to memorize first logic values of the clock signal at time instants of edges of delayed replicas in the set of delayed replicas; a second set of flip-flop devices (e.g., 921, 92*j*, 92N) configured to memorize second logic values of the delayed clock signal at time instants of edges of delayed replicas in the set of delayed replicas (REF_D); a set of logical inversion gates (e.g., 931, 93*j*, 93N) configured to logically invert the memorized second logic values of the delayed clock signal (CK_D), providing inverted second logic values as a result; and a set of logical AND gates (941, 94*j*, 94N) configured to produce the set of edge detecting signals (ED1, EDj, EDN) as a result of applying a logical AND operation to the memorized first logic value of the clock signal (CK) and to the inverted second logic value of the delayed clock signal (CK_D).

Figure 11:
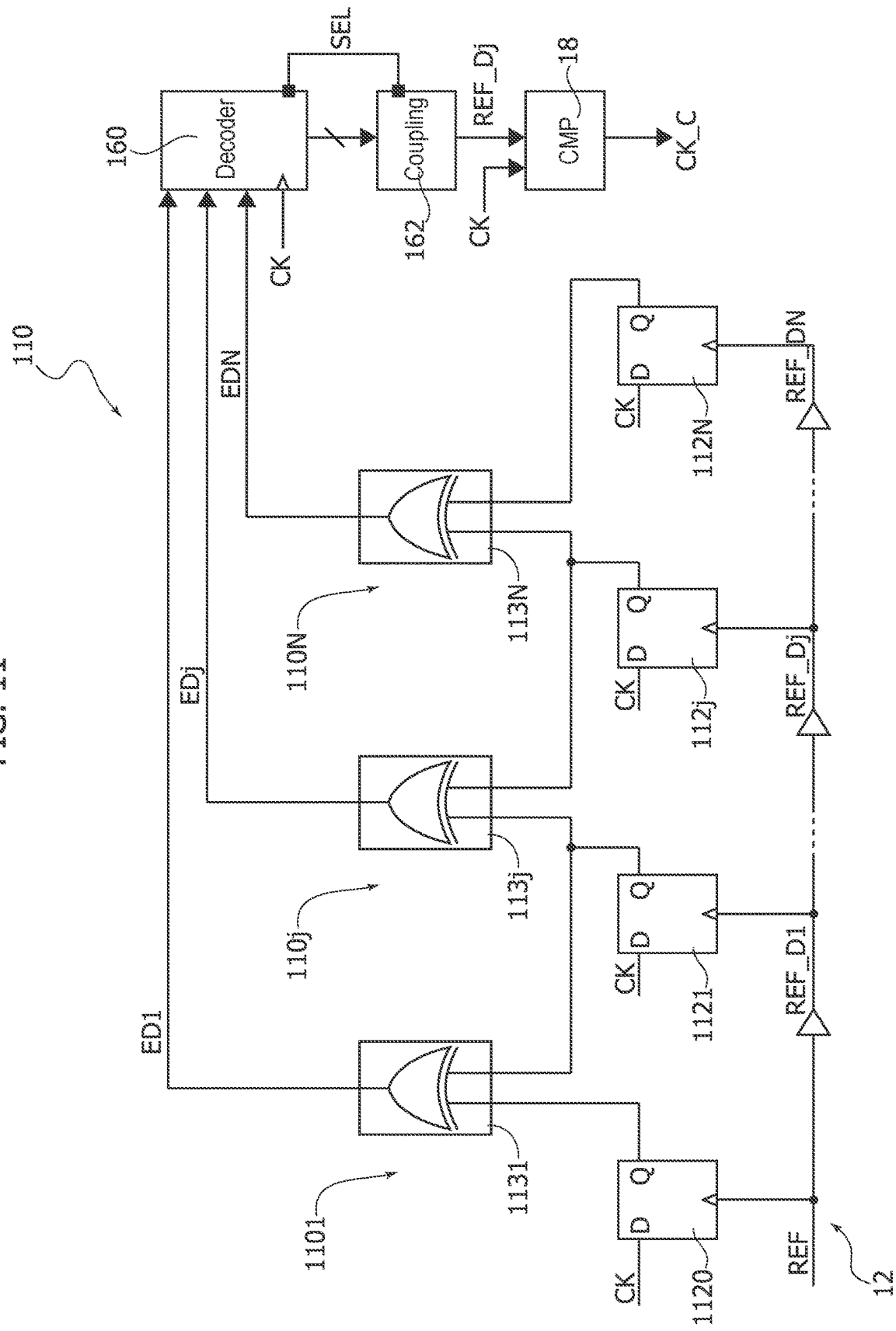
FIG. 11 is a diagram exemplary of an alternative system as per the present disclosure.
Figure 12:
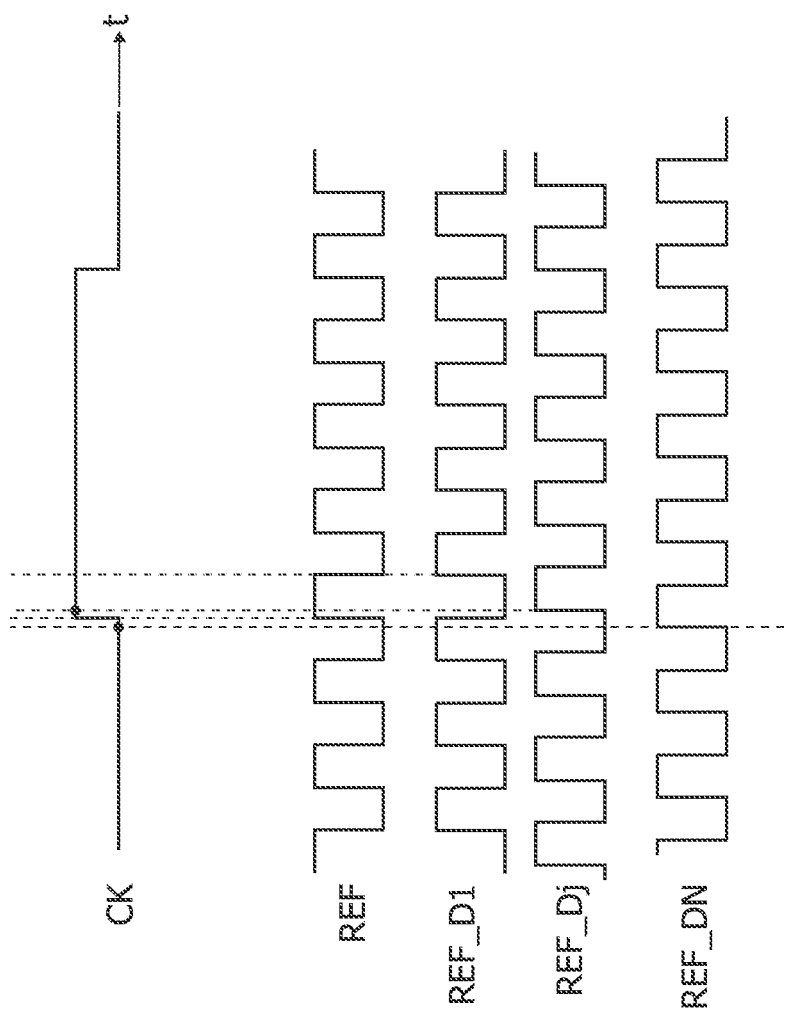
FIG. 12 is a time diagram exemplary of signals in an embodiment as exemplified in FIG. 11.

As exemplified in FIGS. 11 and 12, an alternative system 110 of FIG. 10 may provide a simplified arrangement with respect to that of FIGS. 9 and 10, using solely one clock signal CK.

As exemplified in FIGS. 11 and 12, the alternative system no uses the reference signal REF and the delayed replicas REF_D1, ..., REF_Dj, ..., REF_DN thereof to sample the single clock signal CK. For instance, as exemplified in FIG. 7 the system no comprises a set of edge detecting stages 1101, ..., 110*j*, ..., 110N coupled to the input node CK and coupled to the delay line 12, the set of edge detecting stages 1101, ..., 110*j*, ..., 110N configured to receive the clock signal CK and the set of delayed replicas REF_D1, ..., REF_Dj, ..., REF_DN and to produce a set of edge detection signals ED1, ..., EDj, ..., EDN indicative of a time (or phase) relation between the set of replicas REF_D1, ..., REF_Dj, ..., REF_DN and a first (e.g., rising) edge of the clock signal CK.

As exemplified in FIGS. 11 and 12, edge detecting stages in the set of edge detecting stages 1101, ..., 110*j*, ..., 110N includes: sampling stages (e.g., flip-flops) 1120, 1121, 112*j*, 112N having an input node D coupled to the input clock node CK to receive the clock signal CK and a temporization node coupled to the delay line 12 to receive a j-th delayed replica (e.g., REF_Dj for the j-th first flip-flop 112*j*) of the reference signal REF, the first sampling stages 1120, 1121, 112*j*, 112N further having an output node Q configured to provide a respective value of the clock signal CK at the time instant of the first (e.g., rising) edge of the j-th delayed replica (e.g., REF_Dj); and logic (e.g., XOR) gates 1131, 113*j*, 113N coupled to the sampling stages 1120, 1121, 112*j*, 112N, the logic gates having first input nodes coupled to a (j−1)-th delayed replica (e.g., REF or REF_1) and second input nodes coupled to a j-th delayed replica (e.g., REF_1 or REF_j) and configured to provide at output respective edge detecting signals ED1, EDj, EDN having a value equal to the logical XOR combination of the clock signal sampled by time-consecutive, adjacent delayed replicas (e.g., REF_1 and REF_j) of the reference signal.

As exemplified in FIGS. 11 and 12, for instance: the clock signal CK is sampled (e.g., via flip-flops 112*j*, 112N) by adjacent replicas (e.g., j-th replica REF_Dj and N-th replica REF_DN) in the set of reference signal delayed replicas REF, REF_D1, ..., REF_Dj, ..., REF_DN; and the sampled clock signal values are then provided to the j-th logic circuitry (e.g., N-th XOR gate 113N) of each j-th edge detecting stage (e.g., 110N).

For instance, each j-th logic circuitry (e.g., 113N) in each j-th stage (e.g., 110N) is configured to: provide the respective j-th detection signal (e.g., EDN) having a first value (e.g., "0") when the clock signal CK is sampled by both consecutive delayed replicas (e.g., REF_Dj, REF_DN) with a same logic value (e.g., "1"); and provide the respective j-th detection signal (e.g., EDN) having a second value (e.g., "1") when the clock signal CK is sampled with a first logic value by a first delayed replica and with a second logic value by the consecutive delayed replica (e.g., REF_Dj with the first value "0" and REF_DN with the second value "1", as shown in FIG. 12).

In this way, for instance, the j-th reference signal delayed replica REF_Dj that is sampled by the clock signal CK at the first value (e.g., "0") while the adjacent reference signal delayed replica REF_D(j+1) at the second value (e.g., "1") will be the selected (e.g., via the decoder 160, as discussed in the foregoing) as the nearest clock, that is the signal with less phase delay, with respect to the edge of the clock signal CK.

As exemplified in FIG. 11, the set of delayed replicas includes the reference signal and the method includes: storing (for instance, 1120, 1121, 112j, 112N) logic values of the clock signal at time instants of edges of delayed replicas in the set of delayed replicas; and producing the set of edge detecting signals as a result of pairwise applying a logical XOR operation (for instance, 1131, 113j, 113N) to the memorized logic values of the clock signal.

As exemplified in FIG. 11, the set of delayed replicas (REF_D) includes the reference signal (REF) and the system includes: a set of flip-flop devices (for instance, 1120, 1121, 112j, 112N) configured to memorize logic values of the clock signal at time instants of edges of delayed replicas in the set of delayed replicas; and a set of logical XOR gates (for instance, 1131, 113j, 113N) configured to produce the set of edge detecting signals as a result of pairwise applying a logical XOR operation to the memorized logic values of the clock signal.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection. The extent of protection is defined by the annexed claims.

What is claimed is:

1. A method, comprising:
producing a set of delayed replicas of a reference clock signal, wherein delayed replicas in the set of delayed replicas have respective signal edges delayed in time by a mutual time delay therebetween;
producing a set of edge detecting signals comprising edge detecting signals indicative of respective distances of edges of delayed replicas in the set of delayed replicas from an edge of a clock signal having a clock period;
selecting based on edge detecting signals in the set of edge detecting signals a delayed replica in the set of delayed replicas having a distance from a respective clock signal edge that is shorter than the distance from any other clock signal edge of any other delayed replica in the set of delayed replicas;
performing a comparison of the clock period of the clock signal and of the selected delayed replica, obtaining as a result of the comparison, an error signal indicative of a difference therebetween; and
providing the error signal to user circuitry to calibrate the clock signal based on the error signal.

2. The method of claim 1, further comprising producing a delayed clock signal having edges delayed by a time delay from respective edges of the clock signal, wherein first edge detecting signals in the set of edge detecting signals are produced:
having a first logic value in response to delayed replicas in the set of delayed replicas having edges falling inside a time interval between edges of the clock signal and edges of the delayed clock signal, and
having a second logic value in response to delayed replicas in the set of delayed replicas having edges falling outside the time interval between edges of the clock signal and edges of the delayed clock signal.

3. The method of claim 2, further comprising:
storing first logic values of delayed replicas in the set of delayed replicas at time instants of edges of the clock signal;
storing second logic values of delayed replicas in the set of delayed replicas at time instants of edges of the delayed clock signal;
logically inverting the stored first logic values of delayed replicas in the set of delayed replicas, providing inverted first logic values as a result; and
producing the set of edge detecting signals as a result of applying a logical AND operation to the inverted first logic values of the delayed replicas in and to the stored second logic values of delayed replicas of the set of delayed replicas.

4. The method of claim 2, comprising:
storing first logic values of the clock signal at time instants of edges of delayed replicas in the set of delayed replicas;
storing second logic values of the delayed clock signal at time instants of edges of delayed replicas in the set of delayed replicas;
logically inverting the stored second logic values of the delayed clock signal, providing inverted second logic values as a result; and
producing the set of edge detecting signals as a result of applying a logical AND operation to the stored first logic values of the clock signal and to the inverted second logic values of the delayed clock signal.

5. The method of claim 1, wherein first edge detecting signals in the set of edge detecting signals are produced:
having a first logic value in response to a pair of time-consecutive delayed replicas in the set of delayed replicas having edges that sample the clock signal as having a same logic value, and
having a second logic value in response to the pair of time-consecutive delayed replicas in the set of delayed replicas having edges that sample the clock signal as having different logic values therebetween.

6. The method of claim 5, comprising:
storing first logic values of a first subset of delayed replicas in the set of delayed replicas at time instants of edges of the clock signal;
storing second logic values of a second subset of delayed replicas in the set of delayed replicas at time instants of edges of the clock signal, wherein
the set of delayed replicas includes the reference clock signal, and
the first subset of delayed replicas and the second subset of delayed replicas comprise delayed replicas of the reference clock signal that are pairwise time-consecutive;

the method further comprising:
logically inverting the stored second logic values of the second subset of delayed replicas in the set of delayed replicas, providing inverted second logic values as a result; and
producing the set of edge detecting signals as a result of applying a logical AND operation to the stored first logic values of the first subset of delayed replicas and to the inverted second logic values of the second subset of delayed replicas in the set of delayed replicas.

7. The method of claim 5, wherein the set of delayed replicas includes the reference clock signal and the method further comprises:
storing logic values of the clock signal at time instants of edges of delayed replicas in the set of delayed replicas; and
producing the set of edge detecting signals as a result of pairwise applying a logical XOR operation to the stored logic values of the clock signal.

8. A system, comprising:
an input node configured to receive a clock signal having a clock period;
a reference node configured to receive a reference clock signal;
a delay line coupled to the reference node to receive the reference clock signal, the delay line configured to produce a set of delayed replicas of the reference clock signal, wherein delayed replicas in the set of delayed replicas have respective signal edges delayed in time by a mutual time delay therebetween;
a set of edge detecting stages coupled to the input node and to the delay line, the set of edge detecting stages configured to produce a set of edge detecting signals comprising edge detecting signals indicative of respective distances of edges of delayed replicas in the set of delayed replicas from an edge of the clock signal;
selecting circuitry coupled to set of edge detecting stages and configured to select, based on edge detecting signals in the set of edge detecting signals, a delayed replica in the set of delayed replicas having a distance from a respective clock signal edge that is shorter than the distance from any other clock signal edge of any other delayed replica in the set of delayed replicas; and
comparator circuitry coupled to the selecting circuitry to receive the selected delayed replica and to the input node to receive the clock signal, the comparator circuitry configured to perform a comparison of the clock period of the clock signal and of the selected delayed replica, obtaining as a result of the comparison, an error signal indicative of a difference therebetween,
wherein the comparator circuitry is configured to provide the error signal to user circuitry to calibrate the clock signal based on the error signal.

9. The system of claim 8, comprising a clock delay element coupled to the input node to receive the clock signal and to the set of edge detecting stages, the clock delay element configured to produce a delayed clock signal having edges delayed by a time delay from respective edges of the clock signal,
wherein edge detecting stages in the set of edge detecting stages are configured to produce edge detecting signals in the set of edge detecting signals:
having a first logic value in response to delayed replicas in the set of delayed replicas having edges falling inside a time interval between edges of the clock signal and edges of the delayed clock signal, and
having a second logic value in response to delayed replicas in the set of delayed replicas having edges falling outside the time interval between edges of the clock signal and edges of the delayed clock signal.

10. The system of claim 9, wherein the set of edge detecting stages comprises:
a first set of flip-flop devices configured to store first logic values of delayed replicas in the set of delayed replicas at time instants of edges of the clock signal;
a second set of flip-flop devices configured to store second logic values of delayed replicas in the set of delayed replicas at time instants of edges of the delayed clock signal;
a set of logical inversion gates coupled to the first set of flip-flop devices and configured to logically invert the stored first logic values of delayed replicas in the set of delayed replicas, providing inverted first logic values as a result; and
a set of logical AND gates coupled to the set of logical inversion gates and to the second set of flip-flop devices, the set of logical AND gates configured to produce the set of edge detecting signals as a result of applying a logical AND operation to the inverted first logic values of delayed replicas and to the stored second logic values of delayed replicas in the set of delayed replicas.

11. The system of claim 9, comprising:
a first set of flip-flop devices configured to store first logic values of the clock signal at time instants of edges of delayed replicas in the set of delayed replicas;
a second set of flip-flop devices configured to store second logic values of the delayed clock signal at time instants of edges of delayed replicas in the set of delayed replicas;
a set of logical inversion gates configured to logically invert the stored second logic values of the delayed clock signal, providing inverted second logic values as a result; and
a set of logical AND gates configured to produce the set of edge detecting signals as a result of applying a logical AND operation to the stored first logic value of the clock signal and to the inverted second logic value of the delayed clock signal.

12. The system of claim 8, wherein the set of edge detecting stages are configured to produce the set of edge detecting signals:
having a first logic value in response to a pair of time-consecutive delayed replicas in the set of delayed replicas having edges that sample the clock signal as having a same logic value, and
having a second logic value in response to the pair of time-consecutive delayed replicas in the set of delayed replicas having edges that sample the clock signal as having different logic values.

13. The system of claim 12, comprising:
a first set of flip-flop devices configured to store first logic values of a first subset of delayed replicas in the set of delayed replicas at time instants of edges of the clock signal;
a second set of flip-flop devices configured to store second logic values of a second subset of delayed replicas in the set of delayed replicas at time instants of edges of the clock signal, wherein the set of delayed replicas includes the reference clock signal, and the first subset of delayed replicas and the second subset of delayed replicas comprise delayed replicas that are pairwise time-consecutive, the system further comprising:
- a set of logical inversion gates configured to logically invert the stored second logic values of the second subset of delayed replicas in the set of delayed replicas, providing inverted second logic values as a result; and
- a set of logical AND gates configured to produce the set of edge detecting signals as a result of applying a logical AND operation to the stored first logic values of the first subset of delayed replicas and to the inverted second logic values of the second subset of delayed replicas in the set of delayed replicas.

14. The system of claim 12, wherein the set of delayed replicas includes the reference clock signal and wherein the system comprises:
- a set of flip-flop devices configured to store logic values of the clock signal at time instants of edges of delayed replicas in the set of delayed replicas; and
- a set of logical XOR gates configured to produce the set of edge detecting signals as a result of pairwise applying a logical XOR operation to the stored logic values of the clock signal.

15. A method, comprising:
receiving a plurality of time delayed reference clock signals of a first frequency;
receiving a clock signal at a second frequency less than the first frequency;
determining which of the plurality of time delayed reference clock signals has a reference clock edge closest to a clock edge of the clock signal; and
determining a time difference between the determined reference clock edge closest to the clock edge of the clock signal and the clock edge of the clock signal.

16. The method of claim 15, further comprising generating the plurality of time delayed reference clock signals using a delay line.

17. The method of claim 15, wherein determining which of the plurality of time delayed reference clock signals has the reference clock edge closest to a clock edge of the clock signal comprises:
- clocking each of the plurality time delayed reference clock signals into a corresponding plurality of registers using the clock signal as a clock; and
- decoding outputs of a plurality of registers to determine the closest clock edge.

18. The method of claim 17, wherein clocking each of the plurality time delayed reference clock signals into the corresponding plurality of registers comprises:
- clocking each of the plurality time delayed reference clock signals into a corresponding first plurality of registers; and
- clocking an inverted version of each of the plurality time delayed reference clock signals into a corresponding second plurality of registers.

19. The method of claim 15, wherein determining which of the plurality of time delayed reference clock signals has the reference clock edge closest to a clock edge of the clock signal comprises:
- clocking the clock signal into a plurality of registers that are respectively clocked by the plurality of time delayed reference clock signals, wherein each of the plurality of registers corresponds to a respective reference clock signal of the plurality of time delayed reference clock signals.

20. The method of claim 19, wherein the plurality of registers comprises:
- clocking the clock signal into a first plurality of registers that are respectively clocked by the plurality of time delayed reference clock signals; and
- clocking an inverted version of the clock signal into a second plurality of registers that are respectively clocked by the plurality of time delayed reference clock signals.

* * * * *